US009576944B2

(12) United States Patent
Laven et al.

(10) Patent No.: US 9,576,944 B2
(45) Date of Patent: Feb. 21, 2017

(54) SEMICONDUCTOR DEVICES WITH TRANSISTOR CELLS AND THERMORESISTIVE ELEMENT

(71) Applicant: Infineon Technologies AG, Neubiberg (DE)

(72) Inventors: Johannes Georg Laven, Taufkirchen (DE); Christian Jaeger, Munich (DE); Joachim Mahler, Regensburg (DE); Daniel Pedone, Munich (DE); Anton Prueckl, Schierling (DE); Hans-Joachim Schulze, Taufkirchen (DE); Andre Schwagmann, Lehe (DE); Patrick Schwarz, Kallmuenz (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/959,276

(22) Filed: Dec. 4, 2015

(65) Prior Publication Data
US 2016/0163689 A1 Jun. 9, 2016

(30) Foreign Application Priority Data
Dec. 5, 2014 (DE) .................. 10 2014 117 954

(51) Int. Cl.
*H01L 29/94* (2006.01)
*H01L 27/02* (2006.01)
*H01L 29/78* (2006.01)

(52) U.S. Cl.
CPC ....... *H01L 27/0255* (2013.01); *H01L 29/7805* (2013.01)

(58) Field of Classification Search
CPC .............. H01L 27/0255; H01L 29/7805
USPC .............................................. 257/328
See application file for complete search history.

(56) References Cited

U.S. PATENT DOCUMENTS

| 8,000,126 | B2 * | 8/2011 | Morikawa | H01L 27/2436 257/2 |
|---|---|---|---|---|
| 8,319,204 | B2 * | 11/2012 | Terao | G11C 13/0004 257/4 |
| 8,901,647 | B2 * | 12/2014 | Hirler | H01L 27/0255 257/334 |
| 2010/0254425 | A1 | 10/2010 | Habib et al. | |
| 2011/0018054 | A1 | 1/2011 | Pan et al. | |
| 2013/0256699 | A1 | 10/2013 | Vielemeyer et al. | |

FOREIGN PATENT DOCUMENTS

DE     102013004464 A1    10/2013

* cited by examiner

*Primary Examiner* — Luan C Thai
(74) *Attorney, Agent, or Firm* — Murphy, Bilak & Homiller, PLLC

(57) ABSTRACT

A semiconductor device includes a first load terminal electrically coupled to a source zone of a transistor cell. A gate terminal is electrically coupled to a gate electrode which is capacitively coupled to a body zone of the transistor cell. The source and body zones are formed in a semiconductor portion. A thermoresistive element is thermally connected to the semiconductor portion and is electrically coupled between the gate terminal and the first load terminal. Above a maximum operation temperature specified for the semiconductor device, an electric resistance of the thermoresistive element decreases by at least two orders of magnitude within a critical temperature span of at most 50 Kelvin.

25 Claims, 10 Drawing Sheets

SEMICONDUCTOR DEVICES WITH TRANSISTOR CELLS AND THERMORESISTIVE ELEMENT

PRIORITY CLAIM

This application claims priority to German Patent Application No. 10 2014 117 954.4 filed on 5 Dec. 2014, the content of said application incorporated herein by reference in its entirety.

BACKGROUND

In case of a short-circuit, the load current of a power semiconductor switching device increases to a saturation current Isat(Vge) and strongly heats the semiconductor switching device. Typically, a desaturation circuit detects a short circuit condition by comparing a voltage drop across the semiconductor device with a threshold voltage. If the voltage drop exceeds the threshold voltage, the desaturation circuit shuts off the gate signal of the semiconductor switching device in order to avoid its thermal destruction.

It is desirable to improve the reliability of power semiconductor switching devices at short circuits.

SUMMARY

According to an embodiment a semiconductor device includes a first load terminal that is electrically coupled to a source zone of a transistor cell. A gate terminal is electrically coupled to a gate electrode that is capacitively coupled to a body zone of the transistor cell. The source and body zones are formed in a semiconductor portion. A thermoresistive element is thermally connected to the semiconductor portion and electrically connected between the gate terminal and the first load terminal. Above a maximum operation temperature the semiconductor device is specified for an electric resistance of the thermoresistive element changes by at least two orders of magnitude within a critical temperature span of at most 50 degree Kelvin.

According to an embodiment an electric system includes a first load terminal that is electrically coupled to a source zone of a transistor cell. A gate terminal is electrically coupled to a gate electrode that is capacitively coupled to a body zone of the transistor cell. The source and body zones are formed in a semiconductor portion. A thermoresistive element is thermally connected to the semiconductor portion and electrically connected between the gate terminal and the first load terminal. Above a maximum operation temperature the semiconductor device is specified for an electric resistance of the thermoresistive element changes by at least two orders of magnitude within a critical temperature span of at most 50 degree Kelvin.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference sign in the different drawings, respectively, if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors or elements that are controllable to temporarily provide a low-ohmic connection in a first state and a high-ohmic electric decoupling in a second state.

Figure 1A:
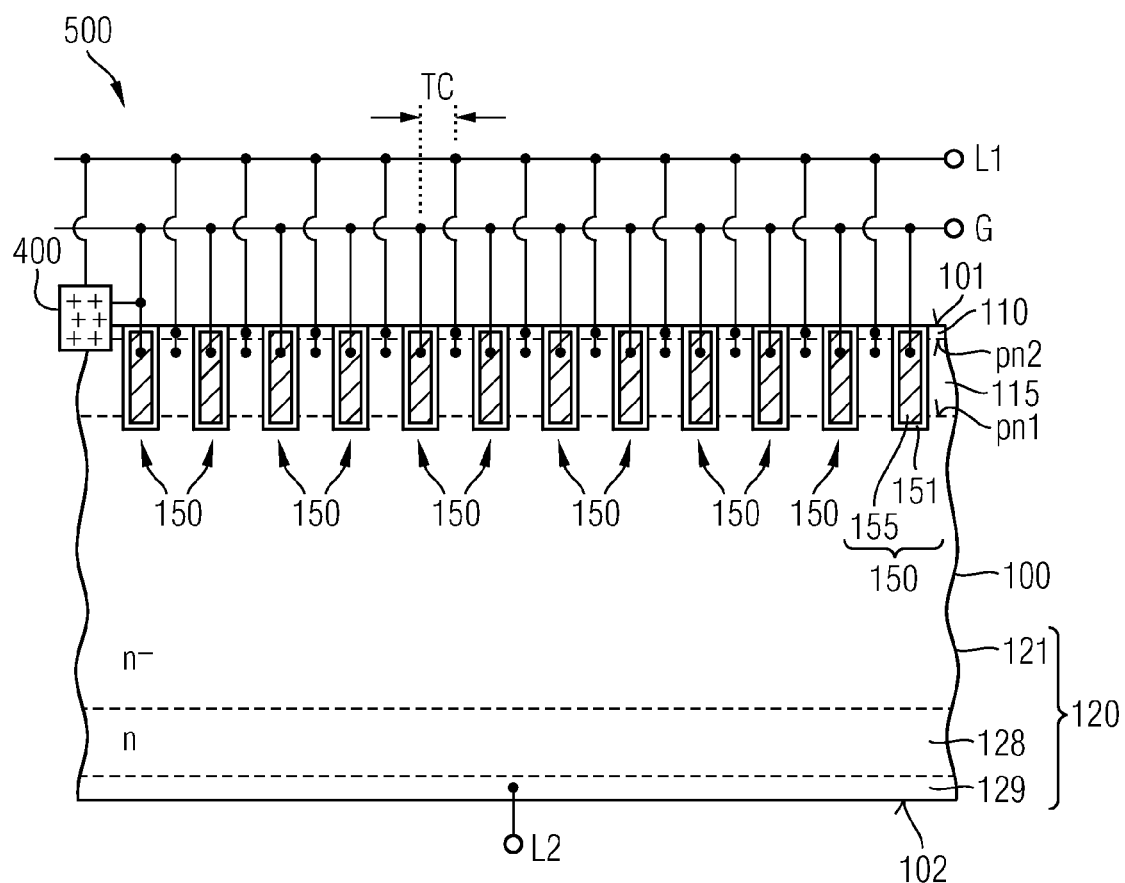
FIG. 1A is a schematic cross-sectional view of a portion of a semiconductor device according to an embodiment concerning a thermoresistive element between a first load terminal and a gate terminal.
Figure 1B:
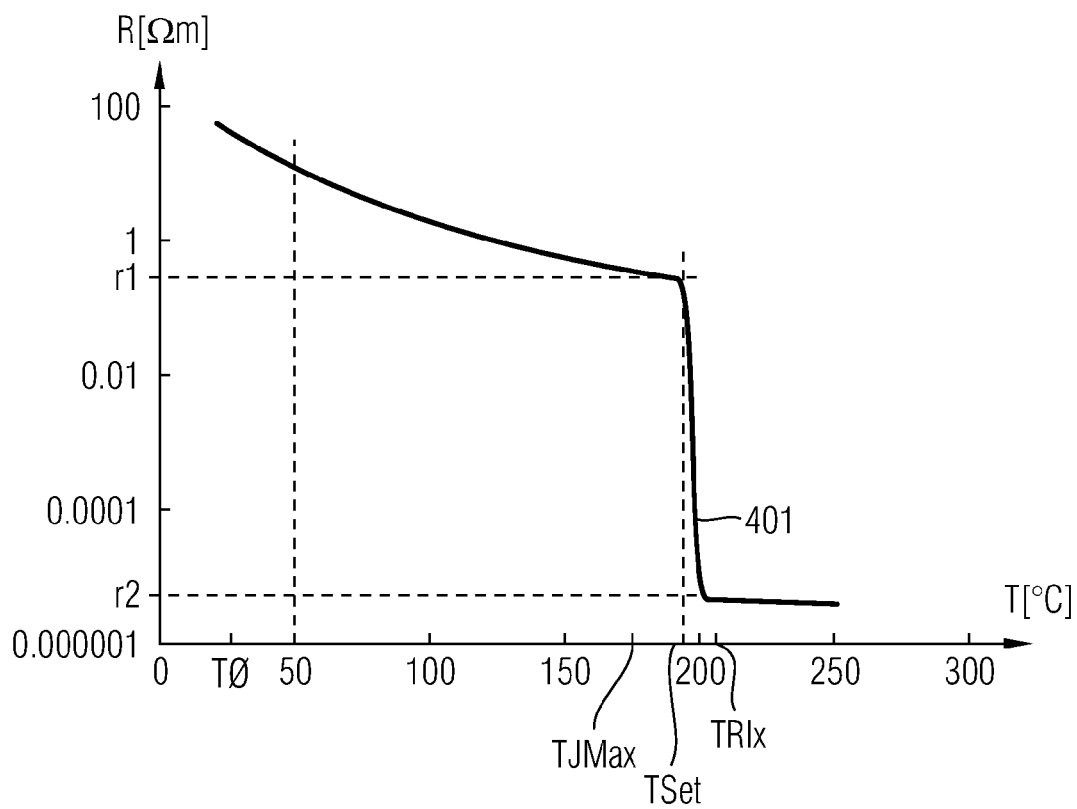
FIG. 1B is a schematic diagram showing a resistance/temperature characteristic of the thermoresistive element in the semiconductor device of FIG. 1A according to an embodiment.
Figure 1C:
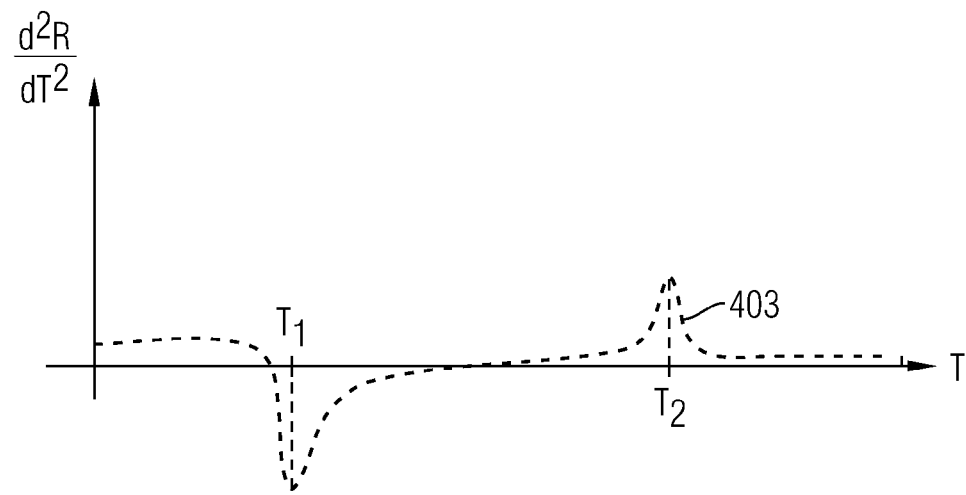
FIG. 1C is a schematic diagram showing the second derivation of the resistance/temperature characteristic of the thermoresistive element in the semiconductor device of FIG. 1A according to a further embodiment.

FIGS. 1A to 1C refer to a semiconductor device 500 including a plurality of identical insulated gate field effect transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT (insulated gate bipolar transistor).

The semiconductor device 500 is based on a semiconductor portion 100 from a single-crystalline semiconductor material, for example silicon (Si), silicon carbide (SiC), germanium (Ge), a silicon germanium crystal (SiGe), gallium nitride (GaN), gallium arsenide (GaAs) or any other $A_{III}B_V$ semiconductor. The semiconductor portion 100 has a first surface 101 at a front side and a second surface 102 at an opposite rear side. Directions orthogonal to the first and second surfaces 101, 102 are vertical directions and directions parallel to the first and second surfaces 101, 102 are horizontal directions.

A minimum distance between the first and second surfaces 101, 102 depends on the voltage blocking capability specified for the semiconductor device 500. For example, the distance between the first and second surfaces 101, 102 may be in a range from 90 μm to 200 μm for a semiconductor device 500 specified for a blocking voltage of about 1200 V. Semiconductor devices 500 with higher blocking capability may include a semiconductor portion 100 with a thickness of several hundred μm, whereas semiconductor portions 100 of semiconductor devices 500 with lower blocking capability may have a thickness of 35 μm to 90 μm. In a plane parallel to the first surface 101 the semiconductor portion 100 may have an approximately rectangular shape with an edge length in a range of several millimeters or may have a circular shape with a diameter of several centimeters.

In the semiconductor portion 100 body zones 115 of the transistor cells TC form first pn junctions pn1 with a drift and rear side structure 120 and second pn junctions pn2 with source zones 110 of the transistor cells TC.

Along the second surface 102 the drift and rear side structure 120 includes a heavily n doped or p doped contact layer 129, which may be a base substrate or a heavily doped layer. Along the second surface 102 a dopant concentration in the contact layer 129 is sufficiently high to form an ohmic contact with a metal directly adjoining the second surface 102. In case the semiconductor portion 100 is based on silicon, in an n-conductive contact layer 129, the dopant concentration along the second surface 102 may be at least $1E18$ cm$^{-3}$, for example at least $5E19$ cm$^{-3}$. In a p-conductive contact layer 129, the dopant concentration may be at least $1E16$ cm$^{-3}$, for example at least $2E17$ cm$^{-3}$.

The drift and rear side structure 120 further includes a drift zone 121 forming the first pn junctions pn1 with the body zones 115. In the drift zone 121 a dopant concentration may gradually or in steps increase or decrease with increasing distance to the first surface 101 at least in portions of its vertical extension. According to other embodiments, the dopant concentration in the drift zone 121 may be approximately uniform in vertical direction. A mean dopant concentration in the drift zone 121 may be between $5E12$ cm$^{-3}$ and $1E17$ cm$^{-3}$, i.e. in a range from $1E13$ cm$^{-3}$ to $5E14$ cm$^{-3}$.

The drift and rear side structure 120 may include further doped zones, for example a field stop layer 128 that separates the drift zone 121 from the contact layer 129, wherein a mean dopant concentration in the field stop layer 128 may be at least five times as high as a mean dopant concentration in the drift zone 121 and at most one fifth of a maximum dopant concentration in the contact layer 129.

A gate structure 150 is formed at the front side. The gate structure 150 may include planar gates formed outside the contour of the semiconductor portion 100 or trench gates extending from the first surface 101 into the semiconductor portion 100.

The gate structure 150 includes a conductive gate electrode 155 that may include or consist of a heavily doped polycrystalline silicon layer and/or a metal-containing layer. The gate electrode 155 is completely insulated against the semiconductor portion 100, wherein a gate dielectric 151 separates the gate electrode 155 at least from the body zones 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

In the illustrated embodiments and for the following description, the transistor cells TC are n channel IGFET cells with p doped body zones 115 and n doped source and drift zones 110, 121. Similar considerations as outlined below apply also to embodiments including p channel IGFET cells with a complementary doping. The contact layer 129 may be n doped in case the semiconductor device 500 is or includes an n-FET or p doped in case the semiconductor device 500 is or includes an n-channel IGBT.

When a voltage applied to the gate electrode 150 exceeds a preset threshold voltage, electrons accumulate in the channel portions of the body zones 115 directly adjoining the gate dielectric 151 and form inversion channels making the second pn junctions pn2 permeable for electrons.

The gate electrode 155 is electrically connected or coupled to a gate terminal G of the semiconductor device 500.

The source zones 110 and the body zones 115 of the transistor cells TC are electrically connected to a first load terminal L1, which may be a source terminal in case the semiconductor device 500 is an IGFET or an emitter terminal in case the semiconductor device 500 is an IGBT. The contact layer 129 is electrically connected to a second load terminal L2, which may be a drain terminal in case the semiconductor device 500 is an IGFET or a collector terminal in case the semiconductor device 500 is an IGBT.

A thermoresistive element 400 is thermally connected to the semiconductor portion 100 and is electrically coupled or connected to both the gate terminal G and the first load terminal L1. An electric resistance of the thermoresistive element 400 decreases by at least two orders of magnitude, three orders of magnitude or even at least four orders of magnitude within a critical temperature span of at most 50 Kelvin, for example at most 30 Kelvin or even at most 15 Kelvin, wherein the critical temperature span starts from a set temperature TSet. The set temperature TSet is at most 50 Kelvin, for example at most 30 Kelvin or even at most 15 Kelvin, above a maximum operation temperature TJMax specified for the semiconductor device 500. Typically, datasheets of IGFETs and IGBTs define a maximum junction temperature as the maximum operation temperature TJMax.

According to an embodiment, the maximum operation temperature TJMax is 175 degree Celsius. According to another embodiment, the maximum operation temperature TJMax is 200 degree Celsius. The critical temperature span may be at most 30 Kelvin, e.g. at most 15 Kelvin. The set temperature TSet may be at most 30 Kelvin above the maximum operation temperature TJMax.

Within an operating temperature range specified for the semiconductor device 500 below the maximum operation temperature TJMax the electric resistance of the thermoresistive element 400 changes, e.g., by at most four orders of magnitude or even more, or at most three orders of magnitude. The operating temperature range may be from −40 degree Celsius or from 25 degree Celsius to TJMax, by way of example.

FIG. 1B shows a specific-electric-resistance/temperature characteristic 401 for a thermoresistive element 400 based on germanium telluride GeTe. According to the illustrated example, the maximum operating temperature TJMax is 175 degree Celsius and the set temperature TSet is approximately 190 degree Celsius. The critical temperature span TR1x-TSet is about 40 Kelvin. Between TSet and TR1x, the specific resistance decreases from a first value r1 at about 0.3 $\Omega$m to a second value r2 at about 6E−06 $\Omega$m. Within an operating temperature range between T0=25 degree Celsius and TJMax, the specific electric resistance decreases by not more than two orders of magnitude.

According to FIG. 1C, the second derivation 403 of a resistance/temperature characteristic according to a further embodiment includes two local extrema indicating a first temperature T1 close to TSet at which an increase of a decrement rate of the electric resistance has a maximum value and a second temperature T2 close to TR1x at which a decline rate of the electric resistance has a maximum value. According to an embodiment, the temperature difference between T2 and T1 is at most 30 Kelvin, e.g. at most 20 Kelvin.

Within the operating temperature range of the semiconductor device 500 the thermoresistive element 400 persistently has a high resistance value such that a gate driver may drive the gate potential applied to the gate electrodes 155 without interference with the potential at the first load terminal L1. When the semiconductor portion 100 of the semiconductor device 500 heats up to beyond the specified maximum operational temperature TJMax, the resistance value of the thermoresistive element 400 sharply decreases and promptly short-circuits the signal applied to the gate terminal G with the potential at the first load terminal L1. The transistor cells TC turn off and the semiconductor device 500 can cool down before being destroyed by an over temperature condition.

According to an embodiment the thermoresistive element 400 may be self-resettable and automatically resumes the high impedance state when the semiconductor portion 100 cools down to below the set temperature TSet. According to another embodiment, the thermoresistive element 400 is not self-resettable and resumes the high impedance state only after having been exposed to a reset temperature TRes higher than the set temperature TSet for a short time.

Conventional desaturation circuits detect a short-circuit condition by comparing the voltage drop across the semiconductor portion 100 with a reference voltage. When the voltage drop across the semiconductor portion 100 exceeds the reference voltage, the desaturation circuit shuts down the gate signal. The desaturation circuit typically further includes an overvoltage protection circuit protecting the gate driver circuit against high voltages and a down-time circuit disabling the desaturation circuit during a turn on of the semiconductor device 500 in order to avoid a misinterpretation of the turning-on as the desaturation condition. Further, an additional wire connection connects a sense output terminal of the semiconductor device 500 with a sense input terminal of the desaturation circuit. In addition, parasitic inductances on the connection lines may significantly delay a detection of the desaturation state. Instead, the thermoresistive element 400 promptly detects and reacts to the desaturation state without the need of sense terminals, additional sense wiring and a complex desaturation circuit.

Compared to usual NTC (negative temperature coefficient) resistors with less steep resistance/temperature characteristics, the thermoresistive element 400 avoids that the gate driver drives the gate signal against a slowly decreasing output impedance, thereby heating up both the gate driver and, due to the increasing gate current through the NTC resistor, a region of the semiconductor portion 100 with which the NTC resistor is in thermal connection. Heating up the NTC resistor through the gate driver may result in an asymmetric and destructive temperature distribution in the semiconductor portion 100.

Figure 2A:
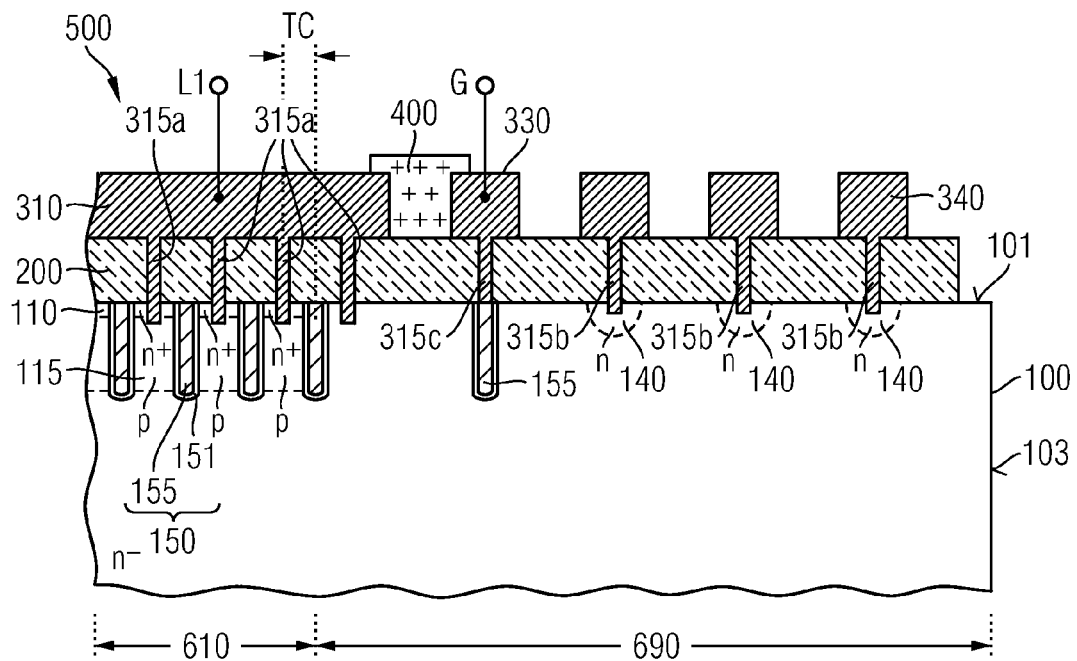
FIG. 2A is a schematic cross-sectional view of a portion of a semiconductor device according to an embodiment concerning a thermoresistive element sandwiched between a first load electrode and a gate conductor above a first surface of a semiconductor portion.
Figure 2B:
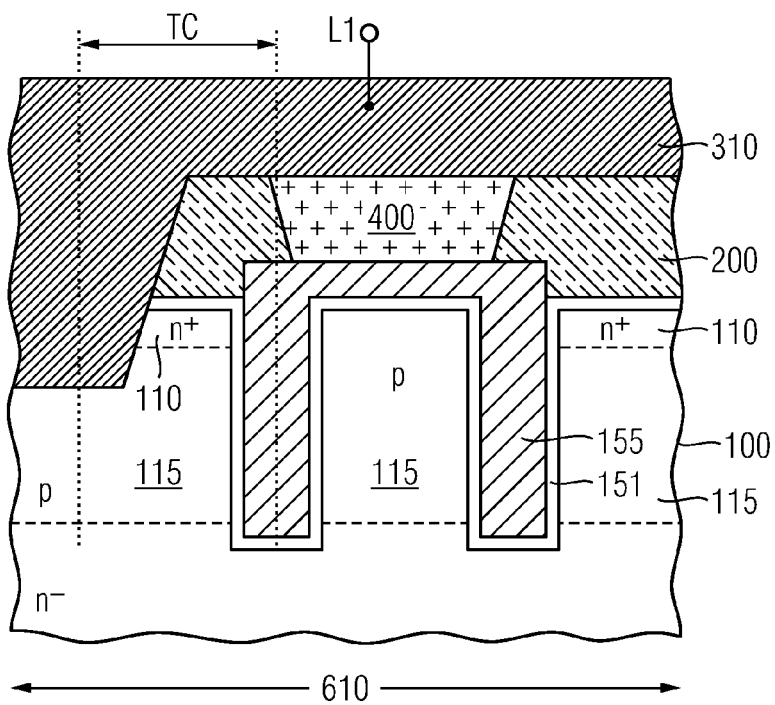
FIG. 2B is a schematic cross-sectional view of a portion of a semiconductor device according to an embodiment concerning a thermoresistive element sandwiched between a first load electrode and a gate electrode.
Figure 2C:
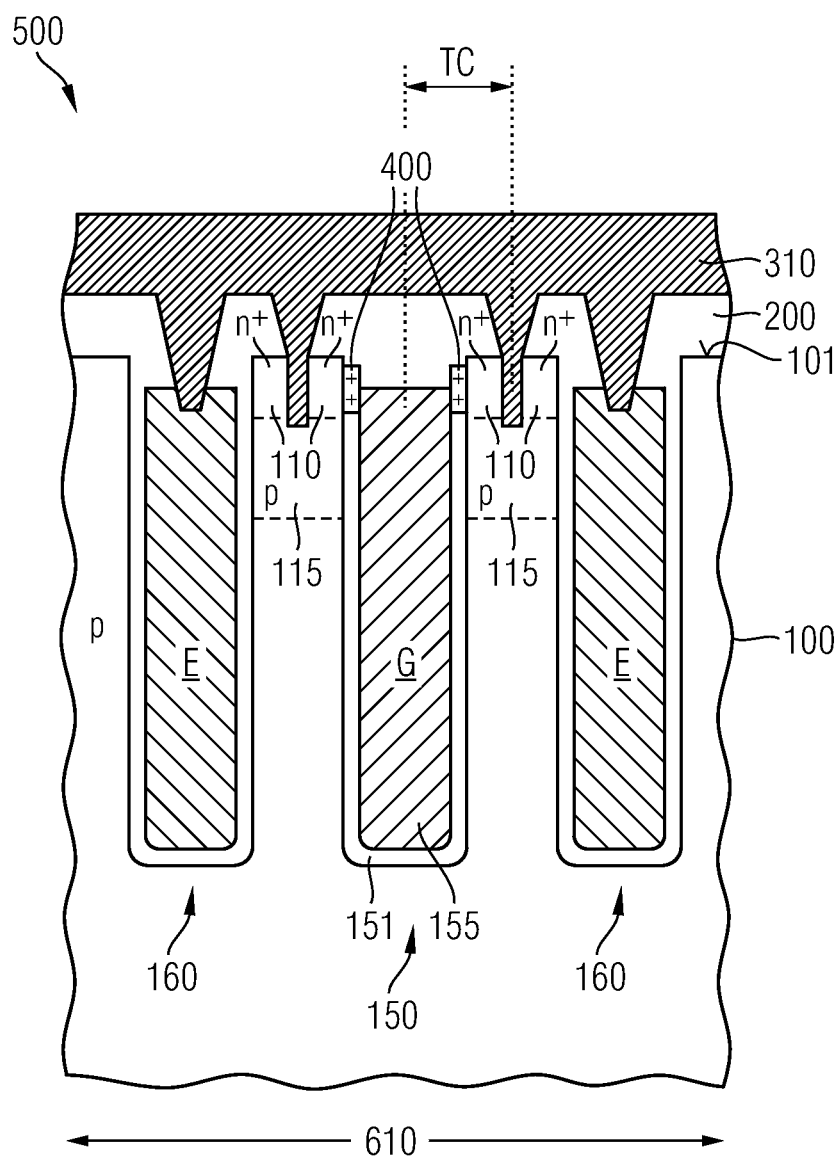
FIG. 2C is a schematic cross-sectional view of a portion of a semiconductor device according to an embodiment concerning a thermoresistive element sandwiched between a gate electrode and a source zone.

FIGS. 2A to 2C concern placement and thermal coupling of the thermoresistive element 400. The thermoresistive element 400 may directly adjoin the semiconductor portion 100 such that the thermoresistive element 400 and the semiconductor portion 100 are directly thermally coupled. According to other embodiments, the thermoresistive element 400 and the semiconductor portion 100 are indirectly thermally coupled through an intermediate, thermally and electrically conductive structure, which may be a semiconductor or a metal structure.

In FIG. 2A a first load electrode 310 is formed at a front side of the semiconductor device 500. An interlayer dielectric 200 separates the first load electrode 310 from the semiconductor portion 100. First contact structures 315a extend from the first load electrode 310 through the interlayer dielectric 200 into the semiconductor portion 100 and electrically connect the first load electrode 310 with the source zones 110 and the body zones 115 of the transistor cells TC in a transistor cell region 610. In an edge region 690 between the transistor cell region 610 and a side surface 103 of the semiconductor portion 100, second contacts 315b electrically connect field rings 340 with doped regions 140 formed along the first surface 101.

Third contact structures 315c may electrically connect a gate conductor 330 formed in the plane of the first load electrode 310 with a gate electrode 155 formed in a portion of the gate structure 150 that extends out of the transistor cell region 610. The gate conductor 330 may include a gate pad for a bond wire, a gate ring surrounding the first load electrode 310, and a gate finger extending from an edge area into a transistor cell area.

The first load electrode 310 may form or may be electrically coupled or connected to a first load terminal L1 which may be a source terminal in case the semiconductor device 500 is an IGFET or an emitter terminal in case the semiconductor device 500 is an IGBT. The gate conductor 330 may form a gate terminal G or may be electrically connected or coupled to a gate terminal G. The field rings 340 may be electrically coupled to the first load electrode 310 or may be electrically connected to network nodes with different electric potentials.

Each of the first load electrode 310, the gate conductor 330 and the field rings 340 may consist of or contain a metal or metal alloy. According to an embodiment, at least the first load electrode 310 contains, as main constituent copper Cu, or alloys of aluminum or copper, for example AlCu or AlSiCu.

The thermoresistive element 400 directly adjoins the first load electrode 310 and the gate conductor 330 and may be formed in a gap separating the first load electrode 310 and the gate conductor 330 above the interlayer dielectric 200. The thermoresistive element 400 may be a single part element or a multi-part element including a plurality of spatially separated portions. With placement of the thermoresistive element 400 between gate conductor 330 and first load electrode 310, the thermoresistive element 400 may extend over a comparatively large area such that requirements as regards the specific resistance of the thermoresistive element 400 are significantly relaxed.

According to another embodiment the thermoresistive element 400 is electrically connected to a first structure, to which a potential of the source zones 110 is applied, and a second structure, to which the gate potential is applied, wherein the first and second structures are formed in a critical portion of the transistor cell region 610, in which a strong heating of the semiconductor portion 100 can be expected.

In FIG. 2B, the thermoresistive element 400 is sandwiched between the gate electrode 155 and the first load electrode 310. The thermoresistive element 400 may be a multi-part element with several spatially separated portions, wherein at least some of the portions are arranged in the transistor cell region 610 such that the thermoresistive element 400 is strongly thermally coupled with the semiconductor portion 100 in the transistor cell region 610. For self-resettable thermoresistive elements 400 the placement of the thermoresistive elements 400 between gate electrode 155 and the first load electrode 310 may allow for a selective turn-off of transistor cells TC in areas, where the temperature exceeds the maximum operational temperature TJMax.

FIG. 2C refers to a semiconductor device 500 with gate structures and field electrode structures 160 extending from a first surface 101 into a semiconductor portion 100. The thermoresistive element 400 is sandwiched between a source zone 110 and a gate electrode 155 in the gate structure 150. For example, the thermoresistive element 400 may replace a portion of a dielectric layer separating the gate electrode 155 and the semiconductor material of the semiconductor portion 100 and forming a gate dielectric 151. The thermoresistive element 400 may be formed in the vertical projection of a portion of the gate dielectric 151 between the concerned portion of the gate dielectric 151 and the first surface 101.

The thermoresistive element 400 may be a multi-part element with a plurality of spatially separated portions which can be arranged at strong thermal coupling with the semiconductor portion 100 within the transistor cell region 610 and close to regions of the semiconductor portion 100 in which a strong dynamic load is effective and a significant rise of the temperature takes place. In the case of a limited lateral extent of the thermoresistive element 400 the distance between the thermoresistive elements 400 is smaller than 500 µm, smaller than 50 µm, smaller than 20 µm, or even smaller than 5 µm. For self-resettable thermoresistive elements 400 the placement of the thermoresistive elements 400 between gate electrode 155 and source zones 110 may allow for a local turn-off of only such transistor cells TC in which the temperature exceeds the maximum operational temperature TJMax.

Figure 3A:
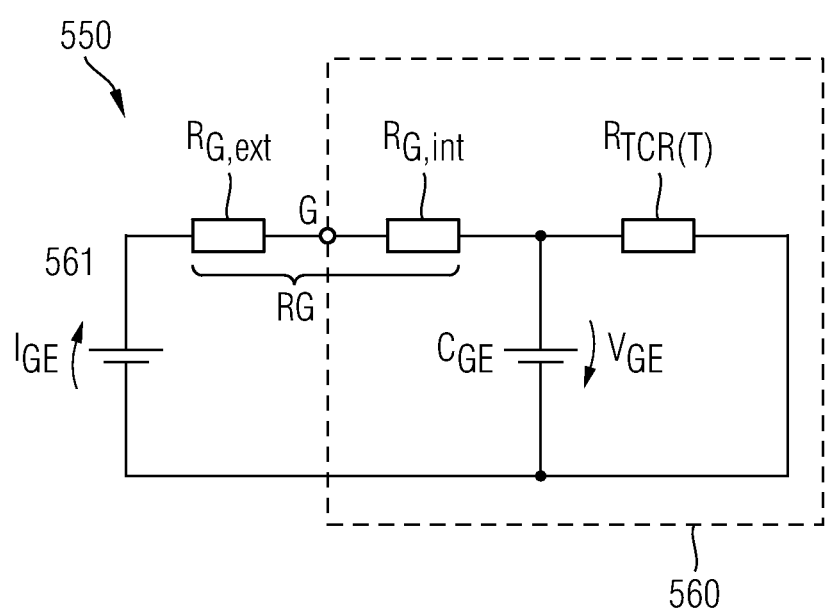
FIG. 3A is a schematic equivalent circuit diagram of a gate circuit of a power semiconductor switching device with a thermoresistive element according to an embodiment.
Figure 3B:
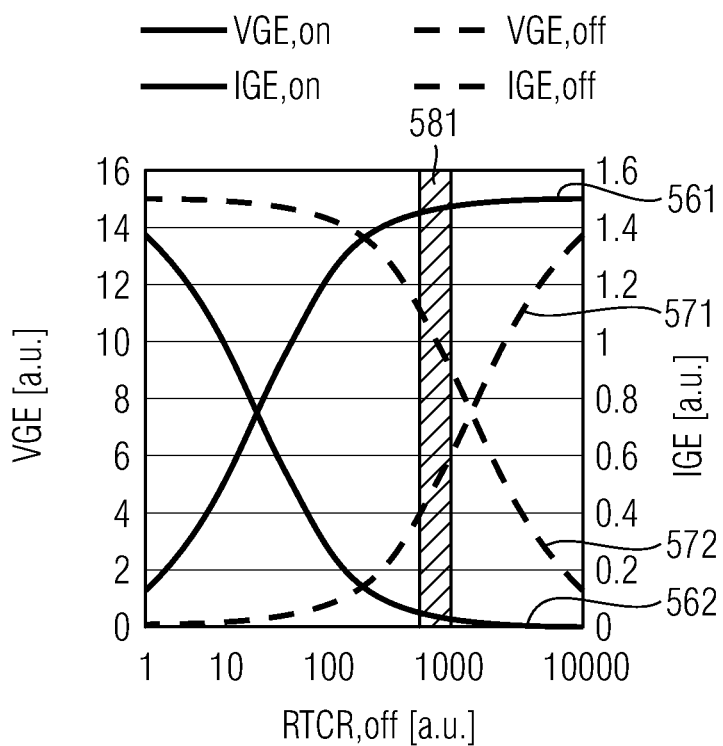
FIG. 3B is a schematic diagram showing gate voltage and gate leakage current as a function of a resistance of the thermoresistive element according to an embodiment referring to a gate resistance of 10Ω.
Figure 3C:
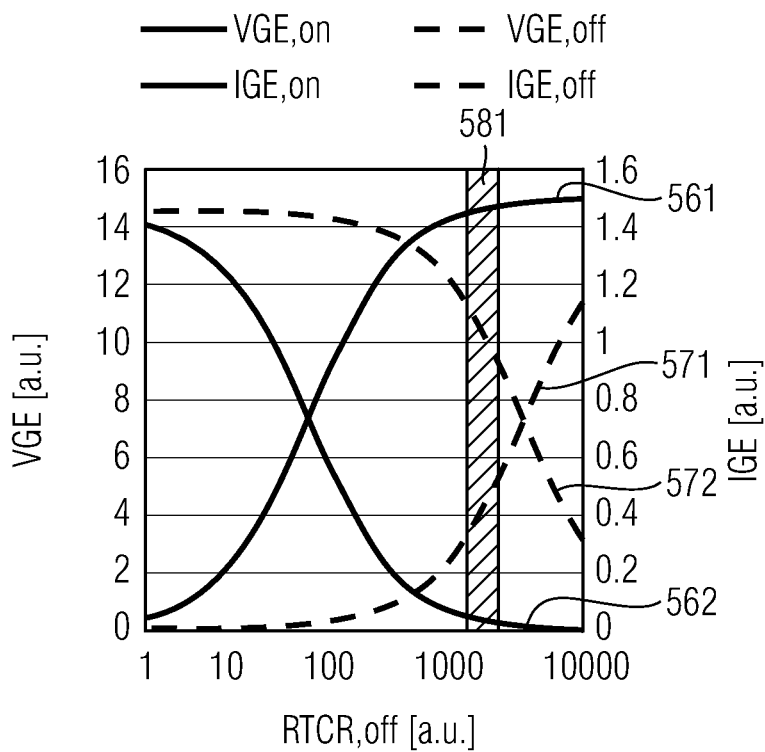
FIG. 3C is a schematic diagram showing gate voltage and gate leakage current as a function of a resistance of the thermoresistive element according to an embodiment referring to a gate resistance of 33Ω.

FIGS. 3A to 3C refer to an equivalent circuit diagram of the gate circuit 550 of the semiconductor device 500. A gate driver drives a gate current IGE. A gate input resistance RG includes an external portion RG,ext including the resistance of the connection line between gate driver and the semiconductor device 500. An internal gate resistance RG,int is effective within the semiconductor device 500 between the gate terminal G and the gate electrode. The gate electrode represents a gate-to-emitter capacity CGE across which the effective gate voltage VGE drops. The thermoresistive element 400 is effective as a temperature-dependent resistance RTCR(T) parallel to the gate-to-emitter capacity CGE.

According to an embodiment, the internal gate resistance RG,int includes a polycrystalline silicon resistor formed between the gate conductor and the gate electrode. The resistance value of RG,int is determined such that a time constant t=1/(RG*CGE) has a predefined value. According to an embodiment, the resistance value of RG,int is in a range from 1Ω to 10Ω.

Figure 8A:
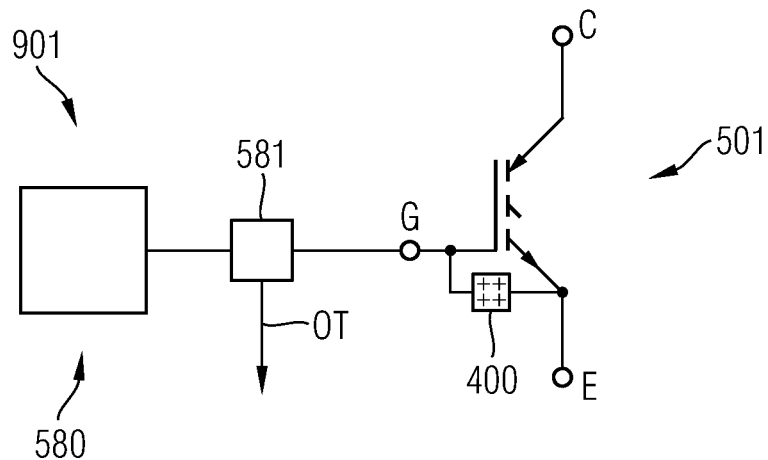
FIG. 8A is a schematic block diagram of an electric system according to an embodiment concerning an over-temperature detection.

In FIG. 3B line 561 shows the effective gate voltage VGE,on and line 562 the gate leakage current IGE,on for the nominal operation range below TJMax. Line 571 shows the effective gate voltage VGE,off and line 572 shows the corresponding gate leakage current IGE,off for a save turn-off above TJMax for a gate resistance RG of 10Ω as a function of the resistance value RTCR(T) of the thermoresistive element 400, at a decreasing rate of the resistance value of the thermoresistive element 400 of two orders of magnitude within the critical temperature span. The marked area 581 illustrates the usable resistance range of the thermoresistive element 400, in which VGE,on is above 14.5 V and VGE,off for the save off-state is below 6 V. In the marked area 581, IGE,off significantly rises to beyond 1 A and IGE,on to about 50 mA. The increased gate leakage currents may be used to detect an overtemperature condition as illustrated in FIG. 8A.

The thermal energy dissipated in the thermoresistive element 400 in the save off-state may be about 2%, 0.5%, or even less of the electric power dissipated during a transition from the on-state of the semiconductor device to the off-state.

FIG. 3C shows the same lines 561, 562, 571, 572 and the corresponding marked area 581 for a gate resistance of 33Ω.

According to an embodiment, the thermoresistive elements 400 in the previous Figures include PCMs (phase change materials) with a high-impedance amorphous state and a low-impedance ordered, e.g., crystalline state. The PCMs may be self-resettable and may resume the low-impedance state by cooling down to below the set temperature TSet, wherein a reset pulse applied to the gate electrode may enhance the recovery process of the PCM. For example the thermoresistive elements 400 may be based on nickel-iron-oxygen (Ni—Fe—O) powder with a reversible change of the specific resistance by about two orders of magnitude at 250 degree Celsius. According to other embodiments, the thermoresistive element 400 includes at least one of $Ti_{2(1-x)}V_{2x}O_3$, $La_xEu_{1-x}CoO_3$, $GdCoO_3$, $GdCoO_3$, $SmCoO_3$, $NdCoO_3$, $PrCoO_3$ with $3 \leq x \leq 1$.

According to another embodiment, the thermoresistive elements 400 in the previous Figures are not self-resettable and can resume the low-impedance state only at a reset temperature above the set temperature TSet. For example, the thermoresistive element 400 may be based on a telluride or a chalcogenide PCM. The thermoresistive element 400 may be based on germanium telluride which characteristics are only to a low degree a function of a deposition thickness.

Beyond TSet the resistance value of the thermoresistive element 400 may remain approximately constant or may slightly increase such that a gate driver electrically coupled to the gate terminal G of the semiconductor device 500 may be configured to apply a reset pulse with a sufficient pulse current and pulse duration to heat up the thermoresistive element 400 to beyond the reset temperature TRes.

According to an embodiment, the semiconductor device 500 may include one or more service terminals electrically connected to the thermoresistive element 400 to allow, by applying a suitable voltage across the thermoresistive element 400, an activation of the semiconductor device 500 before shipment and a reset of the semiconductor device 500 after thermal shutdown while at the same time the semiconductor device 500 may be operated in combination with conventional gate drivers.

The following figures refer to further embodiments of the thermoresistive element 400.

Figure 4:
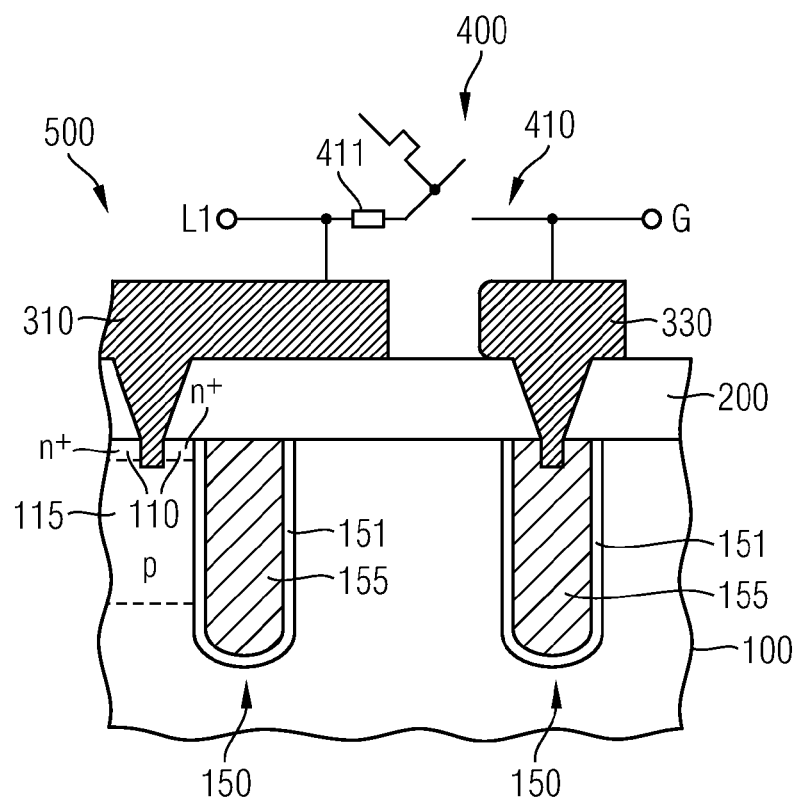
FIG. 4 is a schematic diagram of a portion of a semiconductor device in accordance with an embodiment concerning a thermoresistive element based on a bimetallic structure.

In FIG. 4 the thermoresistive element 400 includes a bimetallic device 410 including at least two portions of different metals which expand at different rates with increasing temperature. The two portions of different metals are bonded to each other along an interface between them. A first end portion of the bimetallic is fixed to either the first load electrode 310 or the gate conductor 330. A second end portion is free to move. At a temperature below the set temperature TSet the first load electrode 310 or the gate conductor 330 is separated from the bimetallic device 410. With increasing temperature, the bimetallic device 410 bends into direction of the portion with the lower coefficient of thermal expansion and at the set temperature TSet the bimetallic device 410 is in touch with both the gate conductor 330 and the first load electrode 310. A resistance structure 411 may be arranged in series with the bimetallic device 410.

Figure 5:
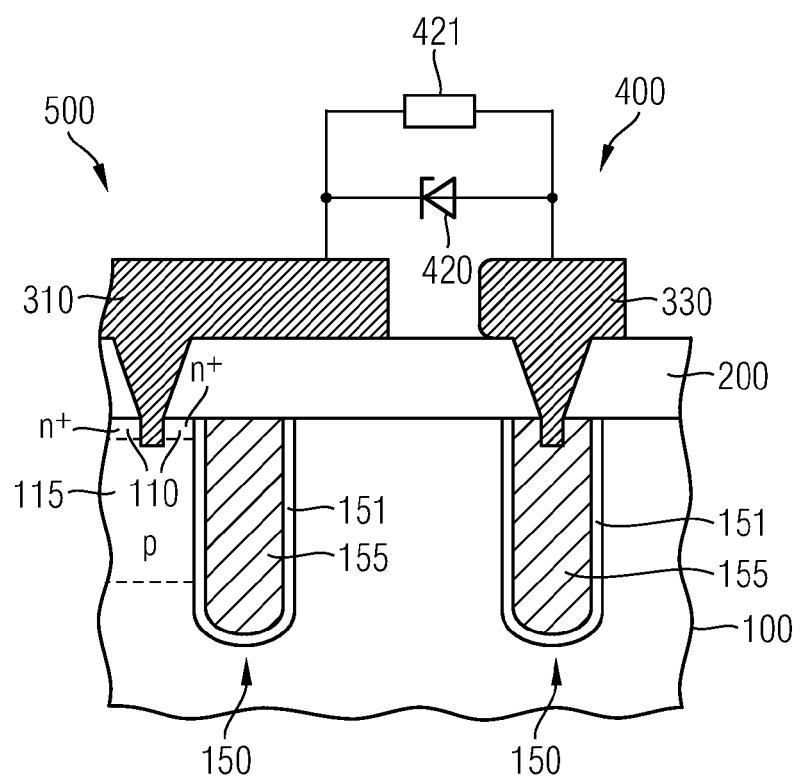
FIG. 5 is a schematic diagram of a portion of a semiconductor device in accordance with an embodiment concerning a thermoresistive element based on diode elements with negative temperature coefficients.

FIG. 5 refers to an embodiment with one or more serially connected NTC diodes 420 with negative temperature coefficient, e.g. appropriately doped Zener diodes or tunnel diodes, electrically connected between the first load electrode 310 and the gate conductor 330. The NTC diodes 420 may be realized in trenches extending from the first surface 101 into the semiconductor portion 100, for example in trenches equal or similar in dimension to the gate structures 150. The negative temperature coefficient can be tuned by a suitable doping of the NTC diodes. A parallel resistance 421 may be electrically arranged in parallel with the NTC diode(s) 420.

Figure 6A:
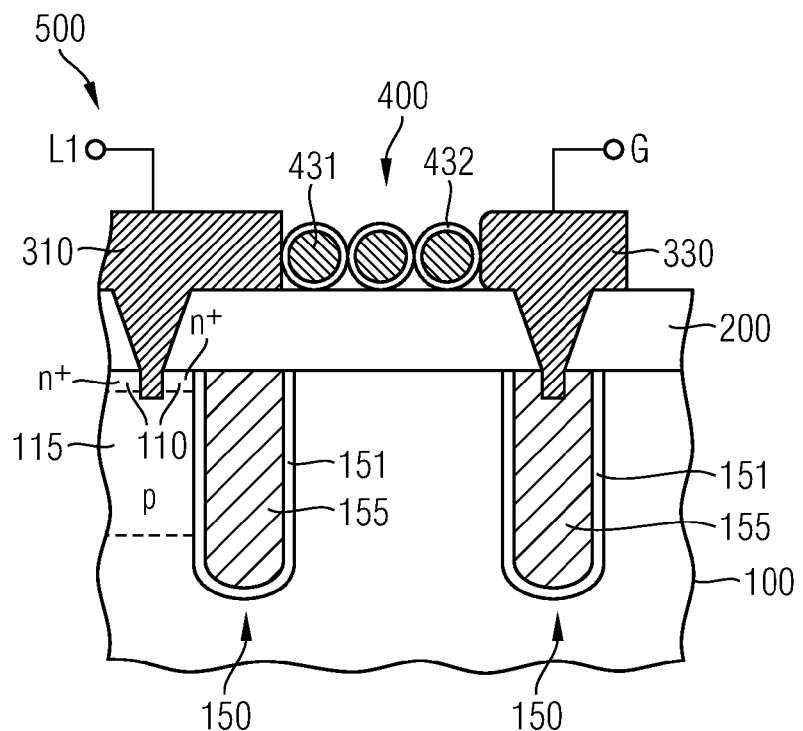
FIG. 6A is a schematic cross-sectional view of a portion of a semiconductor device in accordance with an embodiment concerning thermoresistive elements based on metallic particles enclosed in a dielectric shell, in a high-conductive state.
Figure 6B:
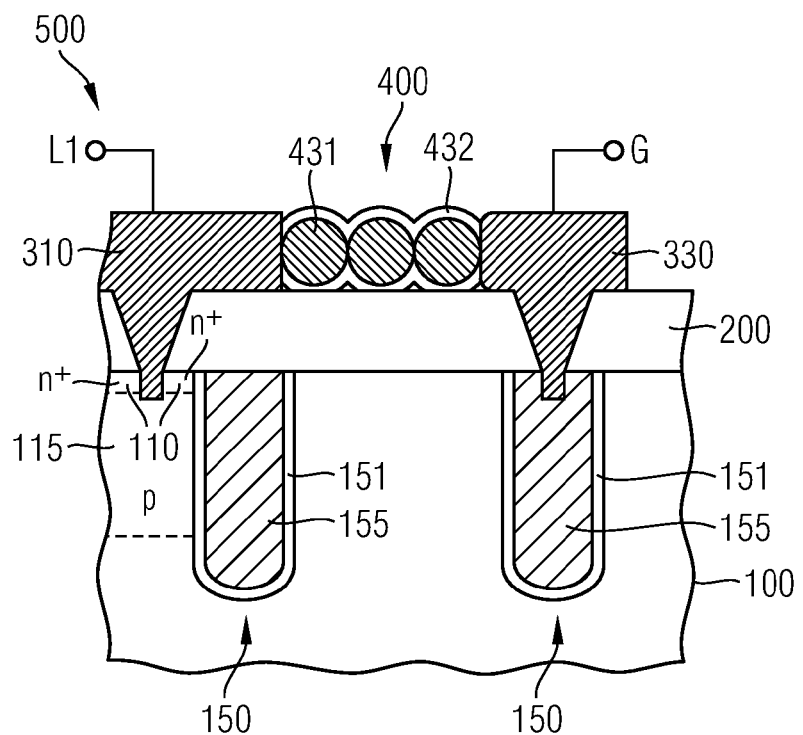
FIG. 6B is a schematic cross-sectional view of the semiconductor device portion of FIG. 6A in a low-conductive state.

In FIGS. 6A and 6B the thermoresistive element 400 is at least partially fitted between the first load electrode 310 and the gate conductor 330 and includes metallic particles 431, for example metallic spheres, enclosed in shells 432 of dielectric material with a melting temperature at or close to the set temperature TSet. For example, the metal is silver (Ag) or copper (Cu) and the dielectric shell material is a polymer such as polycarbonate, polyimide, polysulfone or highly polymerized polyvinylacetate.

At a temperature below the set temperature TSet the dielectric shells electrically separate the metallic particles 431 from each other, from the first load electrode 310, and from the gate conductor 330 that adjoin the thermoresistive element 400 on opposing sides as illustrated in FIG. 6A.

At the set temperature TSet, the dielectric shells 432 start melting and neighboring metallic particles 431 get into contact with each other as illustrated in FIG. 6B. The electric resistance decreases by about two orders of magnitude. When the temperature falls below the melting temperature, the dielectric shells 432 recover such that the number of contacts and the total contact area decrease again. The resistance increases up to approximately the original value.

Figure 7A:
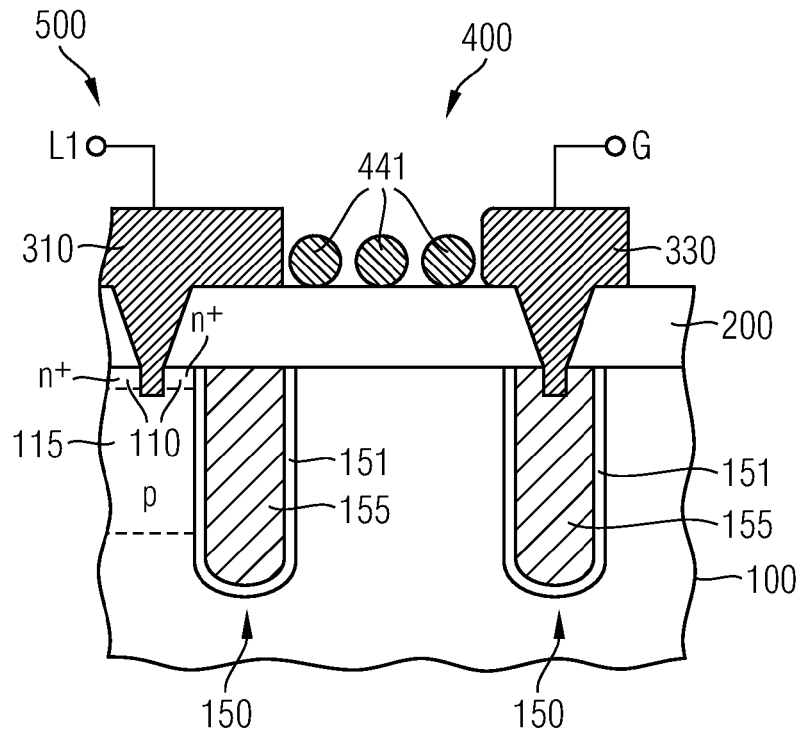
FIG. 7A is a schematic cross-sectional view of a portion of a semiconductor device in accordance with an embodiment concerning thermoresistive elements based on plasto-elastic metallic particles, in a high-conductive state.
Figure 7B:
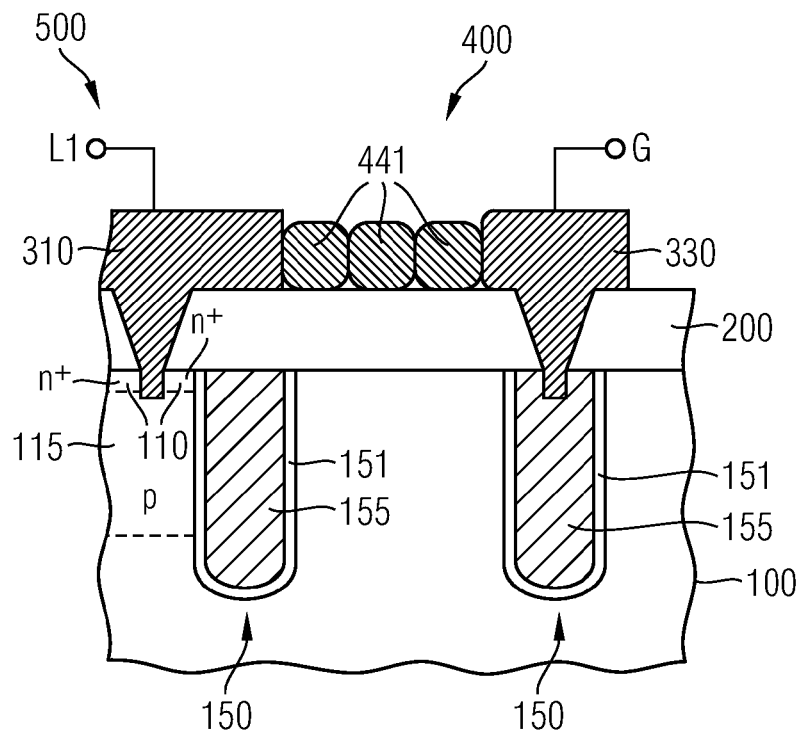
FIG. 7B is a schematic cross-sectional view of the semiconductor device portion of FIG. 7A in a low-conductive state.

FIGS. 7A to 7B refer to an embodiment with the thermoresistive element 400 at least partially fitted between the first load electrode 310 and the gate conductor 330. The thermoresistive element 400 includes metallic particles 441, for example metallic spheres.

With increasing temperature the metallic particles 441 expand and contact areas between the metallic particles, between the metallic particles 441 and the first load electrode 310, as well as between the metallic particles 441 and the gate conductor 330 grow as illustrated in FIG. 7B. The size of the metallic particles 441, for example a diameter of metallic spheres, is adjusted such that the total surface contact area significantly increases at the set temperature TSet. According to an embodiment the metallic particles 441 are elastically deformable Ag or Cu spheres.

According to an embodiment, the thermoresistive element 400 includes a composite system based on a PCM matrix and metallic spheres which may be coated with a dielectric material.

Thermoresistive elements 400 of FIGS. 6A to 7B as well as thermoresistive elements based on PCMs may be formed by inkjet printing a dispersion including the metallic spheres and the PCM material as well as a liquid with a boiling temperature below the set temperature TSet such as cyclohexane and glycol. PCMs may also be deposited by a sputter process.

An electric system 901 illustrated in FIG. 8A includes a gate driver circuit 580 with an output terminal electrically coupled to a gate terminal G of a power semiconductor switching device 501 that includes a thermoresistive element 400 electrically connected between an emitter terminal E and a the gate terminal G. An overtemperature detection circuit 581, which may be integrated in the gate driver circuit 580, may monitor the gate leakage currents and may output a signal OT indicating the presence of an overtemperature condition in the power semiconductor switching device 501 when the gate leakage currents exceed a predefined threshold. The electric system 901 may be an IGBT module, a half-bridge circuit, a full bridge circuit or a switched mode power supply, by way of example.

Figure 8B:
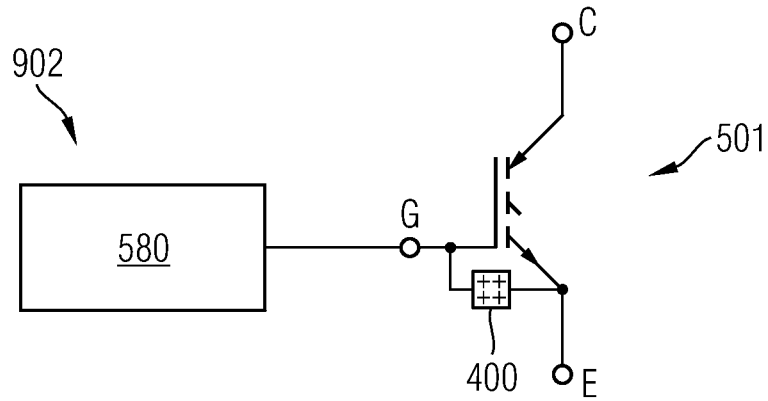
FIG. 8B is a schematic block diagram of an electric system according to an embodiment concerning a reset of a not self-resettable thermoresistive element.

In FIG. 8B an electric system 902 includes a gate driver circuit 580 suitable to drive a reset pulse for resetting, from a low-conductive state to a high-conductive state, a not self-resettable thermoresistive element 400 in a power semiconductor switching device 501. For example, the gate driver circuit 580 may supply a drive current of at least 10 A.

Figure 8C:
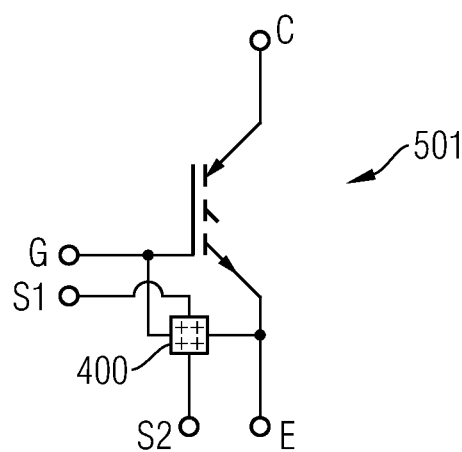
FIG. 8C is a simplified circuit diagram of semiconductor device according to an embodiment related to an external reset of a not self-resettable thermoresistive element.

FIG. 8C shows a power semiconductor switching device 501 including two service terminals S1, S2 for applying a suitable reset pulse for resetting, from a low-conductive state to a high-conductive state, a not self-resettable thermoresistive element 400 in the power semiconductor switching device 501. In the application, the service terminals S1, S2 may be electrically connected to a controllable driver circuit or may be accessible for service personal. According to other embodiments, the power semiconductor switching device 501 includes only one service terminal S1 and the reset pulse is applied using the service terminal S1 and one of the other terminals G, E or C.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first load terminal electrically coupled to a source zone of a transistor cell;
a gate terminal electrically coupled to a gate electrode which is capacitively coupled to a body zone of the transistor cell, the source and body zones being formed in a semiconductor portion; and
a thermoresistive element thermally connected to the semiconductor portion and electrically coupled between the gate terminal and the first load terminal,
wherein above a maximum operation temperature specified for the semiconductor device, an electric resistance of the thermoresistive element decreases by at least two orders of magnitude within a critical temperature span of at most 50 Kelvin.

2. The semiconductor device of claim 1, wherein a set temperature at a beginning of the critical temperature span is at most 50 Kelvin above the maximum operation temperature.

3. The semiconductor device of claim 1, wherein within an operating temperature range specified for the semiconductor device below the maximum operation temperature, the electric resistance of the thermoresistive element changes by less than four orders of magnitude.

4. The semiconductor device of claim 1, wherein a temperature difference between a minimum and a maximum in the second derivation of a resistance/temperature characteristic of the thermoresistive element is less than 50 Kelvin.

5. The semiconductor device of claim 1, wherein the critical temperature span is at most 30 Kelvin.

6. The semiconductor device of claim 1, further comprising:
a first load electrode electrically connected to the first load terminal and arranged at a distance from the semiconductor portion, wherein the thermoresistive element is interposed between the first load electrode and the gate electrode.

7. The semiconductor device of claim 1, further comprising:
a first load electrode electrically connected to the first load terminal; and
a gate conductor electrically connected to the gate electrode,
wherein the first load electrode and the gate conductor are arranged at a distance from the semiconductor portion,
wherein the thermoresistive element is interposed between the first load electrode and the gate conductor.

8. The semiconductor device of claim 6, further comprising:
an interlayer dielectric interposed between the semiconductor portion and the first load electrode.

9. The semiconductor device of claim 6, wherein the first load electrode is made of copper or a copper-containing alloy.

10. The semiconductor device of claim 1, wherein the gate electrode extends from a first surface into the semiconductor portion and the thermoresistive element is interposed between the source zone and the gate electrode.

11. The semiconductor device of claim 1, wherein the thermoresistive element is a self-resettable element and the electric resistance of the thermoresistive element changes to an original resistance value when the thermoresistive element cools down to below a set temperature at a beginning of the critical temperature span.

12. The semiconductor device of claim 11, wherein the thermoresistive element comprises a bimetallic system configured to separate the gate terminal and the first load terminal below the set temperature and to electrically connect the gate terminal and the first load terminal above the set temperature.

13. The semiconductor device of claim 11, wherein the thermoresistive element comprises one or more Zener and/or tunnel diodes with negative temperature coefficient.

14. The semiconductor device of claim 11, wherein the thermoresistive element is based on a self-resettable phase change material.

15. The semiconductor device of claim 11, wherein the thermoresistive element comprises metallic particles enclosed in shells of a dielectric material with a melting temperature at the set temperature.

16. The semiconductor device of claim 11, wherein the thermoresistive element comprises elastically deformable metallic particles.

17. The semiconductor device of claim 11, wherein the thermoresistive element is a composite system comprising a reversible phase change material and at least one of elastically deformable conductive particles and conductive particles enclosed in shells of a dielectric material with a melting temperature at the set temperature.

18. The semiconductor device of claim 1, wherein the thermoresistive element includes a phase change material configured to change from a low-ohmic state to a high-ohmic state by heating above a reset temperature higher than a set temperature at a beginning of the critical temperature span.

19. The semiconductor device of claim 18, further comprising:
at least one service terminal electrically connected to the thermoresistive element.

20. The semiconductor device of claim 1, further comprising:
an internal gate resistance between the gate terminal and the gate electrode.

21. The semiconductor device of claim 1, wherein the effective resistance of the thermoresistive element decreases by at least two orders of magnitude within a critical temperature span of at most 50 Kelvin.

22. The semiconductor device of claim 1, wherein a distance between neighboring thermoresistive elements is smaller than 500 μm.

23. An electric system comprising a semiconductor device, wherein the semiconductor device comprises
a first load terminal electrically coupled to a source zone of a transistor cell;
a gate terminal electrically coupled to a gate electrode which is capacitively coupled to a body zone of the transistor cell, the source and body zones being formed in a semiconductor portion; and
a thermoresistive element thermally connected to the semiconductor portion and electrically coupled between the gate terminal and the first load terminal,
wherein above a maximum operation temperature specified for the semiconductor device, an electric resistance of the thermoresistive element decreases by at least two orders of magnitude within a critical temperature span of at most 50 Kelvin.

24. The electric system of claim 23, wherein the thermoresistive element is not self-resettable and the electric system further comprises:
a gate driver circuit electrically coupled or connected to the gate terminal and configured to supply, to the gate terminal, a first gate voltage for switching off the transistor cell, a second gate voltage for switching on the transistor cell and a reset current for resetting the thermoresistive element.

25. The electric system of claim 23, further comprising:
an overtemperature detection circuit configured to output a signal indicating an overtemperature condition when a gate current supplied to the gate terminal exceeds a preset threshold.

* * * * *